(12) United States Patent
Yabashi

(10) Patent No.: US 11,335,476 B2
(45) Date of Patent: May 17, 2022

(54) WIRE HARNESS

(71) Applicant: SUMITOMO WIRING SYSTEMS, LTD., Yokkaichi (JP)

(72) Inventor: Tomohiro Yabashi, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 131 days.

(21) Appl. No.: 16/980,777

(22) PCT Filed: Mar. 11, 2019

(86) PCT No.: PCT/JP2019/009570
§ 371 (c)(1),
(2) Date: Sep. 14, 2020

(87) PCT Pub. No.: WO2019/188163
PCT Pub. Date: Oct. 3, 2019

(65) Prior Publication Data
US 2021/0012923 A1    Jan. 14, 2021

(30) Foreign Application Priority Data

Mar. 30, 2018  (JP) .............................. JP2018-069922

(51) Int. Cl.
| | |
|---|---|
| *H01R 4/18* | (2006.01) |
| *H01B 7/00* | (2006.01) |
| *H01R 4/64* | (2006.01) |
| *H05K 9/00* | (2006.01) |
| *B60R 16/02* | (2006.01) |

(52) U.S. Cl.
CPC ............. *H01B 7/0045* (2013.01); *H01R 4/18* (2013.01); *H01R 4/64* (2013.01); *H05K 9/009* (2013.01); *B60R 16/0215* (2013.01)

(58) Field of Classification Search
CPC .......... H01B 7/0045; H01R 4/10; H01R 4/18; H01R 4/183; H01R 4/58; H01R 4/64; H05K 9/009; B60R 16/0215
See application file for complete search history.

(56) References Cited

U.S. PATENT DOCUMENTS 7,041,907 B2 * 5/2006 Miyazaki ........... H01R 13/6581
                                                       174/72 A

FOREIGN PATENT DOCUMENTS

| JP | 2004-319196 A | 11/2004 |
| JP | 2006-310474 A | 11/2006 |
| JP | 2008-041479 A | 2/2008 |
| JP | 2012-234761 A | 11/2012 |

OTHER PUBLICATIONS

Apr. 2, 2019 International Search Report issued in International Patent Application No. PCT/JP2019/009570.

* cited by examiner

*Primary Examiner* — Khiem M Nguyen
(74) *Attorney, Agent, or Firm* — Oliff PLC

(57) ABSTRACT

A wire harness including: a tube that is made of metal; a plurality of electrical wires that are inserted into the tube; and a plurality of shields that are formed by braided wires in which conductive strands are woven into a tubular shape, and include tubular portions that respectively cover portions of the electrical wires located outside the tube, wherein portions at one end of the plurality of shields are put together and are fixed to the tube.

6 Claims, 2 Drawing Sheets

WIRE HARNESS

BACKGROUND

The present disclosure relates to a wire harness.

There is a conventional wire harness that includes: a tubular member that is made of a metal; a plurality of electrical wires inserted into the tubular member; and shield members that are made of a metal, are constituted by braided wires in which conductive strands are woven into a tubular shape, and respectively cover portions of the electrical wires located outside the tubular member (see JP 2006-310474A, for example).

In the wire harness disclosed in JP 2006-310474A, portions located outside the tubular member, of two second electrical wires (hereinafter referred to as electrical wires), are covered by a second shield member (hereinafter referred to as a shield member). A connection portion that is formed at one end of the shield member is fastened using a swage ring from the outer peripheral side so as to extend along the outer peripheral surface of the tubular member.

In such a wire harness, electromagnetic noise generated as a result of passing electricity through the electric wires is absorbed by the shield member. The electric charge stored in the shield member as a result of the shield member absorbing the electromagnetic noise is discharged from the aforementioned connection portion to ground via the tubular member.

SUMMARY

When the connection portions of a plurality of shield members are fastened to the outer circumferential surface of the tubular member using a swage ring from the outer peripheral side, the following inconvenience may occur. That is, it is necessary to attach a swage ring to the outer circumferential surface of the tubular member such that the connection portions extend along the outer circumferential surface. Also, the connection portions bend when the swage ring is to be attached, and therefore the attachment positions of the connection portions are unstable and attachment work is troublesome.

An exemplary aspect of the disclosure provides a wire harness in which a plurality of shield members can be easily attached to a tubular member.

A wire harness according to an exemplary aspect includes: a tube that is made of metal; a plurality of electrical wires that are inserted into the tube; and a plurality of shields that are formed by braided wires in which conductive strands are woven into a tubular shape, and include tubular portions that respectively cover portions of the electrical wires located outside the tube, wherein portions at one end of the plurality of shields are put together and are fixed to the tube.

With this configuration, compared to a configuration in which portions at one end of the shields are separately fixed to the tube, the task of attaching the shields to the tube can be performed more easily.

Also, for example, when a portion in which the portions at one end of the shields are put together is fastened using a band so as to extend along the outer circumferential surface of the tube, the portion in which the portions at one end are put together can be fastened more stably.

In the above-described wire harness, it is preferable that the portions at one end of the plurality of shields are fixed to the tube, using a conductive terminal.

With this configuration, the portions at one end of the shields are fixed to the terminal, and the terminal is fixed to the tube, and thus the portions at one end of the shields can be fixed to the tube. Therefore, compared to a mode in which portions at one end of the shields are directly fixed to the tube through soldering or the like, the task of attaching the shields to the tube can be performed more easily.

In the above-described wire harness, it is preferable that the portions at one end of the plurality of shields are press-fitted into the terminal.

With this configuration, portions at one end of the shields are crimped together with the terminal, and thus the portions at one end of the shields are fixed to the terminal. Therefore, the task of fixing the portions at one end of the shields to the terminal can be performed easily.

In the above-described wire harness, it is preferable that a first assembly in which first portions of the plurality of shields are put together, and a second assembly in which second portions of the plurality of shields are put together, are press-fitted into the terminal such that the first assembly and the second assembly are put together.

With this configuration, the first assembly in which first portions of the shields are put together, and the second assembly in which second portions of the shields are put together, need only be press-fitted into the terminal such that the first assembly and the second assembly are put together. Therefore, the task of press-fitting the portions at one end of the shields to the terminal can be performed more easily.

In the above-described wire harness, it is preferable that the terminal is fixed to the tube using a fastener.

With this configuration, it is easy to fix the terminal to the tube by simply using a fastener to fix the terminal to the tube.

In the above-described wire harness, it is preferable that the tube is provided with a seat to which the fastener is fastened.

With this configuration, it is easy to fasten the fastener to the tube by fastening the fastener to the seat of the tube.

In a wire harness according to several aspects of the present disclosure, a plurality of shields can be easily attached to a tube.

DETAILED DESCRIPTION OF EMBODIMENTS

The following describes an embodiment of a wire harness.

Figure 1:
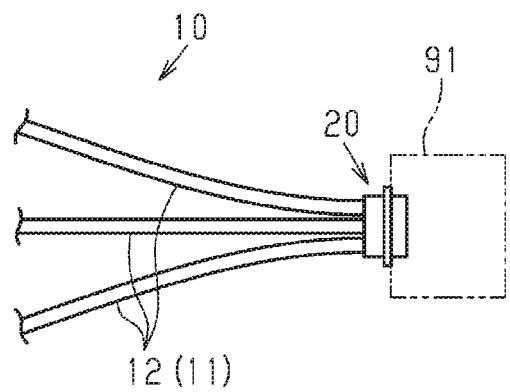
FIG. 1 is a schematic configuration diagram showing an embodiment of a wire harness.

As shown in FIG. 1, a wire harness 10 is to be routed in a hybrid vehicle or an electric car, for example, and electrically connects one device 91 and a plurality of (in the present embodiment, three) devices (not shown) to each other.

The wire harness 10 includes a plurality of (in the present embodiment, six) electrical wires 11, and a pair of connectors 20 into which both ends of each electrical wire are respectively inserted, and at least one flexible protection tube 12 that houses one or more of the plurality of electrical wires 11, or all of them at once. In the example shown in FIG. 1, six electrical wires 11 are separately housed in three protection tubes 12, e.g. two electrical wires in each protection tube. The protection tubes 12 are, for example, corrugated tubes that are made of a synthetic resin material. Note that the connectors 20 are the tubular member (tube) according to the present disclosure.

Figure 2:
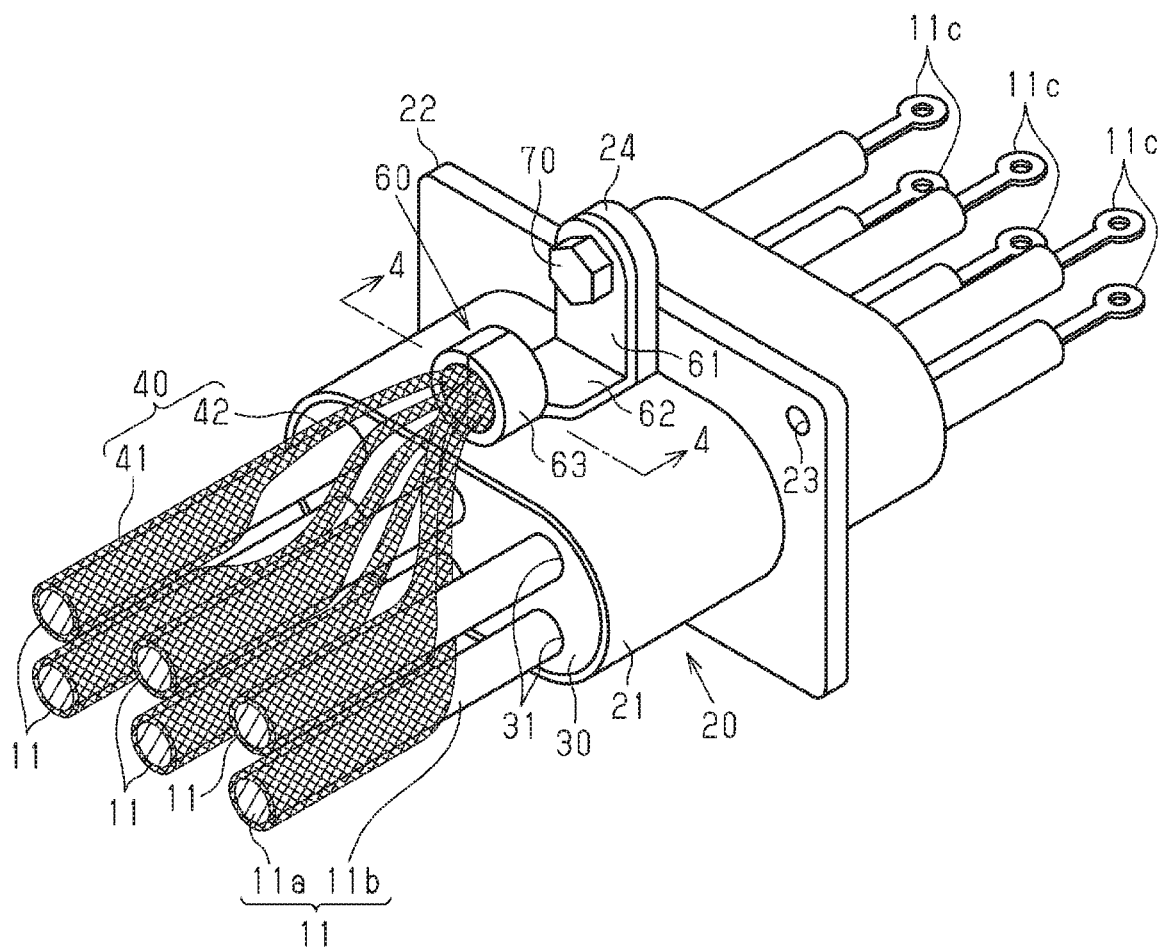
FIG. 2 is an enlarged perspective view of a connector portion of the wire harness shown in FIG. 1.

As shown in FIG. 2, each of the electrical wires 11 includes a core wire 11a and an insulation coating 11b that is cylindrical and covers the outer circumferential surface of the core wire 11a. The core wire 11a is, for example, a stranded wire formed by twisting a plurality of metal strands that are made of a copper alloy. The insulation coating 11b is made of electrically insulative synthetic resin material. A terminal 11c that is to be connected to the device 91 is fixed at an end of each core wire 11a. The terminals 11c may be, but are not limited to, so-called round terminals. Note that the protection tubes 12 are omitted in FIG. 2.

Connectors 20

Next, the configuration of each connector 20 will be described. Hereinafter, the axial direction of the connector 20 may be simply referred to as the axial direction.

As shown in FIG. 2, the connector 20 is to be attached to a housing of the device 91 (not shown), and includes an elliptic cylinder-shaped body portion 21 and a flange 22 that is provided around a central portion of the outer circumferential surface of the body portion 21 in the axial direction. The connector 20 is integrally formed using a metal material such as an aluminum alloy. An attachment hole 23 for attaching the flange 22 to the device 91 is provided in the flange 22.

A seat portion 24 that is provided with a screw hole (not shown) is provided so as to protrude from a portion of the outer circumferential surface of the body portion 21 on the opposite side of the terminals of the electrical wires 11 relative to the flange 22, i.e. a portion that is to be located outside the housing of the device 91.

An elliptic column-shaped supporting member 30 is inserted into the body portion 21. The supporting member 30 is made of an elastic material such as rubber. The outer circumferential surface of the supporting member 30 and the inner circumferential surface of the body portion 21 are in intimate contact with each other. Thus, a gap between the supporting member 30 and the body portion 21 is sealed.

A plurality of through holes 31 that extend in the axial direction are provided in the supporting member 30. In the present disclosure, six through holes 31 are provided according to the number of electrical wires 11.

The electrical wires 11 are respectively inserted into the through holes 31. The outer circumferential surfaces of the electrical wires 11 (specifically the insulation coatings 11b) and the inner circumferential surfaces of the through holes 31 are in intimate contact with each other. Thus, gaps between the electrical wires 11 and the supporting member 30 are sealed.

Terminal Member 60

As shown in FIG. 2, a terminal member 60, which is a so-called open barrel terminal, is fixed to the seat portion 24 of the connector 20, using a screw 70. The terminal member 60 in this embodiment is made of a conductive metal material such as an aluminum alloy.

Figure 3:
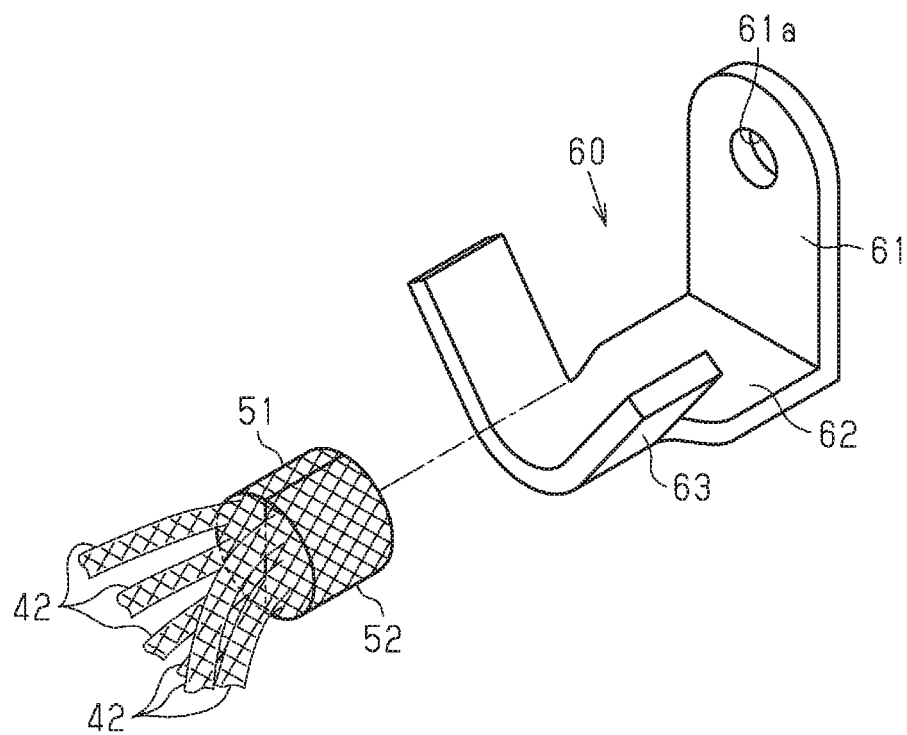
FIG. 3 is an exploded perspective view separately showing a barrel portion of a terminal member and an assembled portion of shield members according to the embodiment shown in FIG. 1.

As shown in FIGS. 2 and 3, the terminal member 60 extends in the radial direction of the connector 20, and includes: a base portion 61 that abuts against the seat portion 24; an extension portion 62 that is bent at a position on the side of the body portion 21 of the connector 20, of the base portion 61, and extends away from the flange 22 in the axial direction; and a barrel portion 63 that is coupled to the extension portion 62.

As shown in FIG. 3, an insertion hole 61a into which the screw 70 is inserted is provided in the base portion 61.

Shield Members 40

Figure 4:
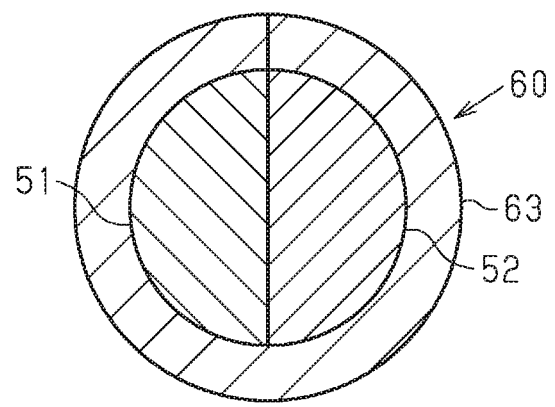
FIG. 4 is a cross-sectional view taken along a line 4-4 in FIG. 2.

As shown in FIGS. 2 to 4, the wire harness 10 includes a plurality of shield members 40 (shields) that include tubular portions 41 that respectively cover portions of the electrical wires 11 located outside the connector 20. The shield members 40 are constituted by braided wires in which conductive strands that are made of an aluminum alloy or the like are woven into a tubular shape. The wire harness 10 in the present embodiment, includes a given number of shield members 40, the number corresponding to the number of electrical wires 11. That is to say, one electrical wire 11 is inserted into the tubular portion 41 of one shield member 40.

An extension portion 42 that extends toward the connector 20 is provided at an end portion of the tubular portion 41 of each shield member 40.

A first assembled portion 51 in which the extension portions 42 of three of the six shield members 40 are put together and are formed into a half-split circular column shape in advance, and a second assembled portion 52 in which the extension portions 42 of the other three shield members 40 are put together and are formed into half-split circular column shape in advance, are abutted against each other and are press-fitted into the cylindrical barrel portion 63 of the terminal member 60 such that the first assembled portion 51 and the second assembled portion 52 are put together and are formed into a circular column shape.

The following describes the operations and effects of the present embodiment.

(1) The wire harness 10 includes: a connector 20 that has a tubular shape and is made of metal; a plurality of electrical wires 11 that are inserted into the connector 20; and a plurality of shield members 40 that are constituted by braided wires in which conductive strands are woven into a tubular shape, and include tubular portions 41 that respectively cover portions of the electrical wires 11 located outside the connector 20. The extension portions 42 provided at one end of the shield members 40 are put together and are fixed to the connector 20. With such a configuration, compared to a configuration in which the extension portions 42 of the shield members 40 are separately fixed to the connector 20, the task of attaching the shield members 40 to the connector 20 can be performed more easily. Therefore, the plurality of shield members 40 can be easily attached to the connector 20.

(2) The extension portions 42 provided at one end of the plurality of shield members 40 are fixed to the connector 20, using the conductive terminal member 60 (conductive terminal).

With such a configuration, the extension portions 42 of the shield members 40 are fixed to the terminal member 60, and the terminal member 60 is fixed to the connector 20, and thus the extension portions 42 of the shield members 40 can be fixed to the connector 20. Therefore, compared to a mode in which extension portions 42 of the shield members 40 are directly fixed to the connector 20 through soldering or the like, the task of attaching the shield members 40 to the connector 20 can be performed more easily.

(3) The extension portions 42 provided at one end of the plurality of shield members 40 are press-fitted into the terminal member 60. The extension portions 42 of the shield members 40 are swaged together with the terminal member 60 so as to be press-fitted to the terminal member 60, and thus the extension portions 42 of the shield members 40 are fixed to the terminal member 60. Therefore, the task of fixing the extension portions 42 of the shield members 40 to the terminal member 60 can be performed easily.

(4) A first assembled portion 51 (first assembly) in which the extension portions 42 of one or more shield members 40 of the plurality of shield members 40 are put together, and a second assembled portion 52 (second assembly) in which the extension portions 42 of the other one or more shield members 40 of the plurality of shield members 40 are put together, are press-fitted into the terminal member 60 such that the first assembled portion 51 and the second assembled portion 52 are put together.

With such a configuration, the first assembled portion 51 in which the extension portions 42 of one or more shield members 40 of the plurality of shield members 40 are put together, and the second assembled portion in which the extension portions 42 of the other one or more shield members 40 are put together, need only be press-fitted into the terminal member 60 such that the first assembled portion 51 and the second assembled portion 52 are put together. Therefore, the task of press-fitting the extension portions 42 of the shield members 40 to the terminal member 60 can be performed more easily.

(5) The terminal member 60 is fixed to the seat portion 24 (seat) of the connector 20, using the screw 70 (fastener).

With such a configuration, it is easy to fix the terminal member 60 to the connector 20 by simply using the screw 70 to fix the terminal member 60 to the connector 20.

The present embodiment can be modified as described below. The present embodiment and the following modifications may be combined with each other as long as no contradiction arises. Note that the embodiment above may be modified as follows.

The mode in which the terminal member 60 is fixed to the connector 20 is not necessarily a mode in which the screw 70 is used. Another fixing mode such as a soldering or welding mode may be employed. If this is the case, the seat portion 24 may be omitted.

The terminal member 60 is not limited to a so-called open barrel terminal illustrated in the above embodiment, and may be a closed barrel terminal that includes a cylindrical barrel portion.

Although the above-described embodiment illustrates a case in which extension portions 42 provided at one end of the shield members 40 are put together in advance as the first assembled portion 51 or the second assembled portion 52, all of the extension portions 42 of the shield members 40 may be put together in advance. Note that the shape into which extension portions 42 of the shield members 40 are put together is not limited to a circular column shape, and may be changed to any shape such as a rectangular column shape.

The mode in which portions at one end of the shield members 40 are fixed to the terminal member 60 need not necessarily be a mode in which press-fitting is used. Another fixing mode such as a soldering or welding mode may be employed.

An assembled portion into which portions at one end of the shield members 40 are put together may be fixed by being fastened using a metal swage ring or the like so as to extend along the outer circumferential surface of the connector 20. If this is the case, the assembled portion of the shield members 40 can be stably fastened to the connector 20. Also, if this is the case, the assembled portion in which portions at one end of the shield members 40 are put together may be directly fixed to the connector 20 through soldering, welding, or the like.

A plurality of electrical wires 11 may be covered by the tubular portion 41 of one shield member 40.

Although the tubular member is embodied as the connector 20 provided at end portions of the electrical wires 11 in the above-described embodiment, the tubular member according to the present disclosure is not limited to such a tubular member, and may be embodied as that provided at central portions of the electrical wires 11 in the lengthwise direction.

In the example in FIG. 3, the first assembled portion 51 may be referred to as a first conductive block that is formed by shaping leading end portions of the extension portions 42 of a first subset (e.g. three shield members 40) of the plurality of shield members 40 into a first predetermined shape that may be a half-split circular column shape, for example. The second assembled portion 52 may be referred to as a second conductive block that is formed by shaping leading end portions of the extension portions 42 of a second subset (e.g. the remaining three shield members 40) of the plurality of shield members 40 into a second predetermined shape that may be a half-split circular column shape, for example. A swaged portion that is formed by combining a plurality of conductive blocks including the first and second conductive blocks (51 and 52) and being swaged by the barrel portion 63 may be referred to as a single terminal conductive block or terminal large-diameter portion that has a third predetermined shape that may be a circular column shape. As a result of the outer surface of the single terminal conductive block being swaged by the barrel portion 63 of the terminal member 60, the plurality of shield members 40 are electrically connected to the body portion 21 of the connector 20 via the terminal member 60 and the seat portion 24. The first predetermined shape of the first conductive block and the second predetermined shape of the second conductive block may be the same, but may be different. The third predetermined shape of the single terminal conductive block may be different from the first and second predetermined shapes of the first and second conductive blocks, but may be the same.

The body portion 21 of the connector 20 may be referred to as a connector housing or a connector hood.

The base portion 61 and the extension portion 62 of the terminal member 60 may be referred to as an L-shaped bracket of the terminal member 60. The base portion 61 may be referred to as a flat bent piece that is bent from the extension portion 62.

The present disclosure includes the following implementation examples. The reference numerals for the constituent elements of the embodiment are provided for the sake of understanding, not for limitation.

[Supplementary Note 1] A wire harness (10) according to several implementation examples includes: a connector hood 21 that is made of metal and has a tubular shape; a plurality of electrical wires (11) that are inserted into the connector hood (21), each of the electrical wires (11) including a first-length portion that is covered by the connector hood (21) and a second-length portion that is not covered by the connector hood (21); a plurality of flexible shield members (40) that are each a conductive braided tube, the plurality of flexible shield members (40) covering the second-length portions of the plurality of electrical wires (11) that are not covered by the connector hood (21); and a single terminal member (60) for fixedly coupling and electrically connecting the plurality of flexible shield members (40) and the connector hood (21) to each other, wherein portions at one end of the plurality of flexible shield members (40) do not cover the outer surfaces of the electrical wires (11) corresponding thereto, and are drawn out so as to extend away from the outer surfaces of the electrical wires (11) corresponding thereto, the portions at one end of the plurality of flexible shield members (40) are put together into a single terminal conductive block, and the single terminal conductive block is fixedly and electrically connected to the connector hood (21) by the single terminal member (60).

[Supplementary Note 2] According to several implementation examples, leading end portions of a first subset that is constituted by a first predetermined number of shield members (40) of the plurality of shield members (40) are integrated into a first conductive block, leading end portions of a second subset that is constituted by a second predetermined number of shield members (40) of the plurality of shield members (40) are integrated into a second conductive block, and the single terminal conductive block is a terminal large-diameter portion formed by combining the first conductive block and the second conductive block.

[Supplementary Note 3] According to several implementation examples, the single terminal member (60) is a one-piece part that includes an L-shaped bracket (61, 62) for fixing the single terminal member (60) to the connector hood (21) and a barrel portion (63) for swaging the single terminal conductive block. [Supplementary Note 4] According to several implementation examples, the L-shaped bracket (61, 62) of the single terminal member (60) includes a flat extension portion (62) that is in contact with an outer surface of the connector hood (21), and a flat bent piece (61) that is bent from the flat extension portion (62) and protrudes in a direction that is orthogonal to the outer surface of the connector hood (21).

It will be apparent to those skilled in the art that the present disclosure may be embodied in other specific forms without departing from the technical idea of the present disclosure. For example, some of the components described in the embodiment (or one or more aspects thereof) may be omitted, or some components may be combined.

The invention claimed is:

1. A wire harness comprising:
 a tube that is made of metal;
 a plurality of electrical wires that are inserted into the tube; and
 a plurality of shields that are formed by braided wires in which conductive strands are woven into a tubular shape, and include tubular portions that respectively cover portions of the electrical wires located outside the tube,
 wherein portions at one end of the plurality of shields are put together and are fixed to the tube.

2. The wire harness according to claim 1,
 wherein the portions at one end of the plurality of shields are fixed to the tube using a conductive terminal.

3. The wire harness according to claim 2,
 wherein the portions at one end of the plurality of shields are press-fitted into the terminal.

4. The wire harness according to claim 3,
 wherein a first assembly in which first portions of the plurality of shields are put together, and a second assembly in which second portions of the plurality of shields are put together, are press-fitted into the terminal such that the first assembly and the second assembly are put together.

5. The wire harness according to claim 2,
 wherein the terminal is fixed to the tube using a fastener.

6. The wire harness according to claim 5,
 wherein the tube is provided with a seat to which the fastener is fastened.

* * * * *